(12) United States Patent
Crevenat

(10) Patent No.: US 11,217,369 B2
(45) Date of Patent: Jan. 4, 2022

(54) OVERVOLTAGE PROTECTION DEVICE

(71) Applicant: CITEL, Sevres (FR)

(72) Inventor: Vincent Crevenat, Reims (FR)

(73) Assignee: CITEL, Sevres (FR)

( * ) Notice: Subject to any disclaimer, the term of this patent is extended or adjusted under 35 U.S.C. 154(b) by 0 days.

(21) Appl. No.: 16/825,059

(22) Filed: Mar. 20, 2020

(65) Prior Publication Data

US 2020/0303096 A1    Sep. 24, 2020

(30) Foreign Application Priority Data

Mar. 20, 2019 (FR) ...................................... 1902877

(51) Int. Cl.
*H01C 7/12* (2006.01)
*H01H 85/04* (2006.01)
(Continued)

(52) U.S. Cl.
CPC ............... *H01C 7/12* (2013.01); *H01H 85/04* (2013.01); *H05K 1/181* (2013.01); *H05K 3/303* (2013.01); *H05K 2201/09263* (2013.01); *H05K 2201/10022* (2013.01); *H05K 2201/10053* (2013.01); *H05K 2201/10181* (2013.01)

(58) Field of Classification Search
CPC .......... H01C 7/12; H01H 85/04; H05K 1/181; H05K 3/303; H05K 2201/09263; H05K 2201/10022; H05K 2201/10053; H05K 2201/10181; H05K 2201/10196; H01T 4/04; H01T 1/16; H02H 9/042; H02H 9/044
See application file for complete search history.

(56) References Cited

U.S. PATENT DOCUMENTS 1,825,298 A     9/1931   Baker
5,923,239 A *   7/1999   Krueger ............... H01H 69/022
                                                        337/297
(Continued)

FOREIGN PATENT DOCUMENTS

CN      201113420 Y      9/2008
CN      109075535 A      12/2018
(Continued)

*Primary Examiner* — Stephen S Sul
(74) *Attorney, Agent, or Firm* — Berenato & White, LLC

(57) ABSTRACT

An overvoltage protection device having a printed circuit board, varistor, and gas discharge tube, the varistor and discharge tube connected in series between a second and third electrical connection terminal of the circuit board via conductive tracks, wherein
the varistor is connected to the first terminal by a third conductive track,
the discharge tube is connected to the varistor by a fourth conductive track,
the discharge tube is connected to the third electrical connection terminal by a sixth conductive track, and
wherein the fourth and sixth conductive tracks have curved portions situated on either side of the discharge tube, having a concavity facing in the same orientation respective to the discharge tube and a thermofusible area able to separate a corresponding track into two parts in response to an overcurrent, a distance between the two parts of each track allowing generation of an arc in response to an overvoltage that activates the discharge tube.

17 Claims, 4 Drawing Sheets

(51) Int. Cl.
  *H05K 1/18* (2006.01)
  *H05K 3/30* (2006.01)

(56) References Cited

U.S. PATENT DOCUMENTS

| | | | | |
|---|---|---|---|---|
| 6,188,557 B1* | 2/2001 | Chaudhry | ............... | H02H 9/06 |
| | | | | 361/111 |
| 6,322,375 B1* | 11/2001 | Cole | ............... | H01R 13/6658 |
| | | | | 439/409 |
| 2005/0099755 A1* | 5/2005 | Martin | ............... | H01T 1/14 |
| | | | | 361/120 |
| 2007/0201177 A1* | 8/2007 | Kladar | ............... | H01H 85/44 |
| | | | | 361/118 |
| 2008/0266730 A1* | 10/2008 | Viborg | ............... | H01T 4/08 |
| | | | | 361/56 |
| 2009/0109584 A1* | 4/2009 | Jones | ............... | H05K 1/0257 |
| | | | | 361/56 |
| 2012/0206848 A1* | 8/2012 | Gillespie | ............... | H02H 5/041 |
| | | | | 361/104 |
| 2014/0092514 A1* | 4/2014 | Chen | ............... | H01C 7/12 |
| | | | | 361/118 |
| 2015/0077889 A1* | 3/2015 | Kauffman | ............... | H03H 7/075 |
| | | | | 361/56 |
| 2016/0374203 A1* | 12/2016 | Bakre | ............... | H05K 1/0265 |
| 2017/0003349 A1* | 1/2017 | Dawley | ............... | G01R 31/3835 |
| 2018/0062374 A1* | 3/2018 | Yang | ............... | H01C 7/126 |
| 2019/0295792 A1* | 9/2019 | Li | ............... | H01H 71/02 |

FOREIGN PATENT DOCUMENTS

| | | |
|---|---|---|
| DE | 102013204039 A1 | 9/2014 |
| FR | 38471 E | 6/1931 |
| JP | 3993256 B2 | 10/2007 |

\* cited by examiner

OVERVOLTAGE PROTECTION DEVICE

CROSS-REFERENCE TO RELATED APPLICATIONS AND CLAIM TO PRIORITY

This application is related to Patent Application No. 1902877 filed Mar. 20, 2019, in France, the disclosure of which is incorporated herein by reference and to which priority is claimed.

FIELD OF THE INVENTION

The invention relates to the field of integrated overvoltage protection components for electrical appliances.

BACKGROUND OF THE INVENTION

In order to protect an electrical appliance, it is common to use a metal oxide varistor, in particular zinc oxide varistor, connected in series with a gas discharge tube, between the two lines of an AC mains.

In such a device, the gas discharge tube supports virtually the entire AC voltage of the mains. Specifically, the stray capacitance of the discharge tube is a few picofarads, whereas the stray capacitance of the varistor is a few nanofarads. When an overvoltage occurs, it triggers the gas discharge tube, which is only extinguished if the current, called follow-up current, subsequently flowing through it becomes low enough. It is the resistance of the varistor that ensures that the follow-up current is limited and makes it possible to extinguish the gas discharge tube.

There are numerous appliances that can be protected with such a device. For example, electronic appliances, telephone and computer systems, photovoltaic appliances, LED lighting appliances and other appliances.

However, protection devices combining varistors and discharge tubes can be complex and bulky.

SUMMARY OF THE INVENTION

The invention relates to providing a protection device that is simple, unobtrusive, and reliable.

To this end, the invention provides an overvoltage protection device having:
a printed circuit board,
a varistor having a varistor body made of metal oxide, having a face and a conductive metal layer deposited on said face,
wherein the varistor is connected to a first electrical connection terminal by a first connection track of the printed circuit board and a disconnection tab, the disconnection tab fastened directly to the metal layer by a thermofusible link and exerting a traction force on said metal layer such that the disconnection tab moves away from the metal layer and disconnects the electrical connection between the first terminal and the varistor in response to melting of the thermofusible link.

The protection device is easy to produce by virtue of these features. In particular, the direct connection between the disconnection tab and the metal layer does not require any terminal link in addition to the deposited metal layer or the disconnection tab. In particular, such a device does not require a copper electrode connecting the metal layer and the disconnection tab.

The device is furthermore unobtrusive by virtue of these features. In particular, this protection device does not require space for an electrode connecting the metal layer and the disconnection tab.

According to various embodiments, such an overvoltage protection device may have one or more of the following features.

According to an embodiment, the varistor has a varistor body made of metal oxide, for example made of zinc oxide.

According to another embodiment, the device furthermore has a gas discharge tube. According to another embodiment, the varistor and the gas discharge tube are connected in series on the printed circuit board.

According to another embodiment, the metal layer or layers are made of silver. According to another embodiment, the metal layer or layers are silver flashes.

According to another embodiment, the metal layer or layers have a thickness of between 8 µm and 16 µm, preferably of between 8 µm and 12 µm, for example 10 µm.

According to another embodiment, the metal layer is deposited through a screen-printing and curing method.

According to another embodiment, the body of the varistor has a cylindrical shape, preferably a right circular cylindrical shape, but may also have a square, rectangular or any other cross-sectional shape. According to another embodiment, the first face and the second face of the body of the varistor are parallel and form the ends of the varistor. According to another embodiment, the varistor has a casing made of resin.

According to another embodiment, the thermofusible solder is made from a tin-based alloy that may contain various other metals such as bismuth, silver or copper, the melting temperature being selected by varying the composition of the alloy. According to another embodiment, the alloy that is used to produce the thermofusible link does not contain lead or cadmium. According to another embodiment, the thermofusible solder consists of a "low-temperature" tin alloy with a melting temperature between 130° C. and 142° C., preferably between 138° C. and 142° C. The thermofusible link may be produced using an alloy provided in the form of a wire, a tab or else a preform, possibly containing a cleaning agent such as a flux cleaner.

According to another embodiment, the metal layer is a first conductive metal layer and the face of the varistor body is a first face of said varistor body and the track of the printed circuit board is a first conductive track of the printed circuit board, the varistor body furthermore having a second metal layer deposited on a second face of the varistor body, said second face being opposite the first face, and the varistor is mounted on the printed circuit board through a direct connection between said second conductive metal layer and a third track of the printed circuit board.

The device is easy to manufacture by virtue of these features. In particular, the direct connection between the second deposited metal layer and the second conductive track does not require any additional component in order to create the connection between the varistor and the third conductive track. Furthermore, such a direct connection between the varistor and the third conductive track has a small footprint, therefore, the device also has a small footprint.

According to another embodiment, the disconnection tab is a leaf spring that is prestressed by the thermofusible link between an end of said leaf spring and the conductive metal layer.

By virtue of these features, the thermofusible link between the disconnection tab and the varistor is simple, while at the same time guaranteeing disconnection between the disconnection tab and the varistor when the thermofusible link melts. Specifically, in the operational state, the connection between the disconnection tab and the varistor is created by the thermofusible link and, when said thermofusible link is degraded, the leaf spring makes it possible to separate the disconnection tab and the varistor without requiring any additional element in order to move said disconnection tab away from the varistor. Once the leaf spring is no longer being prestressed by the thermofusible link, it moves away from the varistor without external assistance.

According to another embodiment, the prestress force applied to the disconnection tab and maintained by the thermofusible link is between 5 N and 10 N, preferably between 6 N and 7 N, more preferably 6.5 N. Such a prestress force is not enough to damage the metal layer, which is relatively thin, while at the same time making it possible to move the disconnection tab and the metal layer apart in the absence of an opposing force, typically when the thermofusible link melts.

According to another embodiment, the disconnection tab consists of a copper alloy.

According to another embodiment, the disconnection tab consists of a copper, beryllium, and nickel alloy. Such an alloy makes it possible to achieve optimum conductivity for the disconnection tab as well as satisfactory elasticity so as not to damage the metal layer under the effect of the prestress exerted on said metal layer by the disconnection tab.

According to another embodiment, the disconnection tab has an anchoring portion fastened to the first track, a flexible portion extending between the anchoring portion and the face of the varistor body, and a fastening portion fastened to the metal layer by the thermofusible link.

According to another embodiment, the disconnection tab has an elasticity characterized by a displacement of the fastening portion along a direction perpendicular to the face of the varistor of 4 mm for a force of between 5 N and 10 N, preferably of between 6 N and 7 N and more preferably 6.5 N, applied to said fastening portion along said displacement direction.

According to another embodiment, the anchoring portion has a length of between 4 mm and 6 mm, preferably about 4.45 mm. According to another embodiment, the flexible portion has a length of between 16 mm and 18 mm, preferably about 17.2 mm. According to one embodiment, the fastening portion has a length of between 1.5 mm and 4 mm, preferably about 2.68 mm. Said lengths are taken along the longitudinal direction of the disconnection tab. According to another embodiment, the disconnection tab furthermore has a thickness of between 0.3 and 0.6 mm, preferably 0.4 mm. According to another embodiment, the disconnection tab has a width of between 3 and 7 mm, preferably 4 mm.

According to another embodiment, the disconnection tab has a rigidity of between 1250 N/m and 2500 N/m, preferably of between 1500 N/m and 1750 N/m, more preferably about 1625 N/m.

According to another embodiment, the disconnection tab has a Vickers hardness of between about 250 and about 310.

According to another embodiment, the disconnection tab has an IACS electrical conductivity greater than or equal to about 48%.

The contact surface between the disconnection tab and the first metal layer is determined as a function of the intended lightning current for the overvoltage protection device. According to another embodiment, a contact surface between the disconnection tab and the first metal layer is between 15.5 mm$^2$ and 17.5 mm$^2$, preferably 16.5 mm$^2$.

According to another embodiment, the disconnection tab is rough. According to another embodiment, the disconnection tab has a surface treatment, for example silvering treatment, tinning treatment, or another treatment.

According to another embodiment, the protection device has an electrical resistance greater than or equal to 0.6 mΩ.

According to another embodiment, the overvoltage protection device furthermore has a protective housing arranged around the varistor. According to another embodiment, the housing is arranged around the gas discharge tube.

Such a protective housing makes it possible to protect the components of the protection device, especially when said device is handled for the purpose of installing it in an electrical circuit.

According to another embodiment, the protective housing has a receptacle forming an internal recess, the varistor being housed in said internal recess, said receptacle having an opening. According to another embodiment, the gas discharge tube is housed in said recess.

According to another embodiment, the printed circuit board forms the cover of the receptacle such that said printed circuit board forms the bottom of the protective housing.

According to another embodiment, the first metal layer is connected to a second conductive track of the printed circuit board by a connection tab. According to another embodiment, this second conductive track connects the connection tab and a fourth electrical connection terminal.

According to another embodiment, the printed circuit board has a sixth conductive track connecting the gas discharge tube and the third electrical connection terminal.

According to another embodiment, the printed circuit board has a fifth conductive track connecting the second metal layer of the varistor and a fifth electrical connection terminal.

According to another embodiment, the invention also provides a method for manufacturing an overvoltage protection device comprising:
  providing a printed circuit board having a plurality of electrical connection terminals and a plurality of conductive tracks,
  providing a varistor having a varistor body made of metal oxide, having a face and a conductive metal layer deposited on said face,
  fastening a disconnection tab to a first track of the printed circuit board, said first track connecting said disconnection tab and a first electrical connection terminal, a tab to be soldered being arranged between the disconnection tab and the first track,
  fastening the varistor to the printed circuit board such that an end of the disconnection tab opposite the first track faces and is spaced from the first metal layer of the varistor, a tab to be soldered being arranged between the varistor and the printed circuit board,
  elastically deforming the disconnection tab so as to bring the second end of said disconnection tab into contact with the metal layer, and
  performing thermofusible soldering between said end of the disconnection tab and the metal layer.

According to another embodiment, after performing the thermofusible soldering, the method furthermore comprises depositing a varnish on the protection device.

According to another embodiment, the method furthermore comprises:
  heating the device in a furnace so as to solder the printed circuit board and the varistor, on the one hand, and the disconnection tab, on the other hand.

According to another embodiment, the varnish is deposited through spraying, for example by way of a varnish spray or resin spray.

According to another embodiment, heating in the furnace is performed at a temperature greater than or equal to 200° C., for example about 270° C.

According to another embodiment, the thermofusible soldering is performed using a thermofusible solder.

According to another embodiment, curing the metal layer or layers deposited on the varistor body comprises a drying phase and a fastening phase. According to another embodiment, the drying phase is performed at a temperature of between 130° C. and 170° C., for example 150° C. According to another embodiment, the drying phase is performed for a duration of between 3 minutes and 20 minutes, for example between 3 minutes and 5 minutes at 150° C. According to another embodiment, the fastening phase is performed at a temperature of between 500° C. and 700° C., preferably 600° C. According to another embodiment, the fastening phase is performed for a duration of between 5 hours and 24 hours.

According to another object of the invention, the invention provides an overvoltage protection device having:
 a printed circuit board,
 a varistor,
 a gas discharge tube, the varistor and the gas discharge tube being connected in series between a second electrical connection terminal and a third electrical connection terminal of the printed circuit board,
wherein:
 the varistor is connected to the second electrical connection terminal by a third conductive track of the printed circuit board,
 the gas discharge tube is connected to the varistor by a fourth conductive track of the printed circuit board,
 the gas discharge tube is connected to the third electrical connection terminal by a sixth conductive track of the printed circuit board,
and wherein the fourth conductive track and the sixth conductive track each have a curved portion, said curved portions being connected to the gas discharge tube and situated on either side of the gas discharge tube, said curved portions each having a concavity facing in one and a same orientation with respect to the gas discharge tube, said curved portions each having a thermofusible area able to separate a corresponding track into two separate parts in response to an overcurrent, a distance between said two separate parts of each track being configured so as to allow a generation of an electrical arc between said two separate parts in response firstly to an overvoltage able to activate the gas discharge tube and secondly a current and a voltage that keep said gas discharge tube in a conductive state.

By virtue of these features, the fourth and sixth conductive tracks form fusible areas able to protect the gas discharge tube, the electrical arc generated in the event of an overvoltage being divided into three arcs in series, an electrical arc being generated in the gas discharge tube and in each of the thermofusible areas, thus making it possible to better control said arcs. Furthermore, thinned portions arranged on the curved portions make it possible to orient the electrical arcs generated at said thinned portions such that the electrical arcs generated at said thinned portions are oriented in opposite directions, limiting the risks of interference between said electrical arcs and making it easier to extinguish said arcs in comparison with a single arc.

According to another embodiments, such an overvoltage protection device may have one or more of the following features in addition to the features already indicated above.

According to another embodiment, the third conductive track, the fourth conductive track and the sixth conductive track together form an open magnetic field loop between the second electrical connection terminal and the third electrical connection terminal in the presence of a current between said second electrical terminal and third electrical connection terminal. Such a magnetic field loop makes it possible to orient the arcs generated at the thermofusible areas such that said arcs do not interfere with one another.

According to another embodiment, a radius of a circle tangent to the thermofusible area of the fourth conductive track forms an angle of between 80 and 100°, preferably an angle of 90°, with a radius of a circle tangent to the thermofusible area of the third conductive track. By virtue of these features, the risks of interference between the arcs generated at the thermofusible areas are reduced, and it is easier to extinguish the arcs.

According to another embodiment, the varistor is connected to a first electrical connection terminal by a disconnection tab, said disconnection tab being connected to the varistor by a thermofusible link able to disconnect the link between the first electrical connection terminal and the varistor in response to an increase in the temperature of the varistor beyond a threshold value, said first electrical connection terminal being intended to be connected to a phase of an electric power supply circuit.

According to another embodiment, the second electrical connection terminal is intended to be connected to a neutral of an electric power supply circuit and the third electrical connection terminal is intended to be connected to ground, the gas discharge tube being connected to a fifth electrical connection terminal by a fifth conductive track, said fifth conductive track being connected to the third conductive track, said fifth electrical connection terminal being intended to be connected to a neutral of an electrical circuit supplied with power by the electric power supply circuit.

According to another embodiment, the varistor is connected to a fourth electrical connection terminal by a second conductive track, said fourth electrical terminal intended to be connected to a phase of the electrical circuit supplied with power by the electric power supply circuit.

According to another embodiment, the invention also provides a method for manufacturing an overvoltage protection device comprising:
 providing a printed circuit board having a plurality of electrical connection terminals and a plurality of conductive connection tracks,
 providing a varistor,
 providing a gas discharge tube,
 depositing the varistor on the printed circuit board such that the varistor is connected to a second electrical connection terminal by a third conductive track,
 depositing the gas discharge tube on the printed circuit board such that the varistor and the gas discharge tube are connected in series between the second electrical connection terminal and a third electrical connection terminal of the printed circuit board via a fourth conductive track connecting the varistor and the gas discharge tube and a sixth conductive track connecting the gas discharge tube to said third electrical connection terminal, the fourth conductive track and the sixth conductive track each having a curved portion, said curved portions being connected to the gas discharge tube and situated on either side of the gas discharge tube, said curved portions each having a concavity facing in one and the same orientation with respect to the gas discharge tube, said curved portions each having a thermofusible area able to separate the corresponding track into two separate parts in response to an overcurrent, the distance between said two separate parts of said tracks being configured so as to allow the generation of an electrical arc between said two separate parts in response firstly to an overvoltage able to activate the gas discharge tube and secondly a current and a voltage that keep said gas discharge tube in the conductive state.

According to another embodiment, in such a manufacturing method, the varistor has a varistor body made of metal oxide, having a face and a conductive metal layer deposited on said face.

According to another embodiment, such a manufacturing method may furthermore comprise, in addition to the features indicated above:
  depositing a disconnection tab on a fifth conductive track of the printed circuit board, said fifth conductive track connecting said disconnection tab and a first electrical connection terminal, the step of depositing the varistor on the printed circuit board is performed such that an end of the disconnection tab opposite the third conductive track faces and is spaced from the metal layer of the varistor,
  elastically deforming the disconnection tab so as to bring a second end of said disconnection tab into contact with a metal layer, and
  performing thermofusible soldering between said end of the disconnection tab and the metal layer.

BRIEF DESCRIPTION OF THE DRAWINGS

The invention will be better understood and further objects, details, features and advantages thereof will become more clearly apparent in the course of the following description of a plurality of particular embodiments of the invention, which are given solely by way of illustration and without limitation, with reference to the appended drawings.

DETAILED DESCRIPTION OF THE PREFERRED EMBODIMENT(S)

Figure 1:
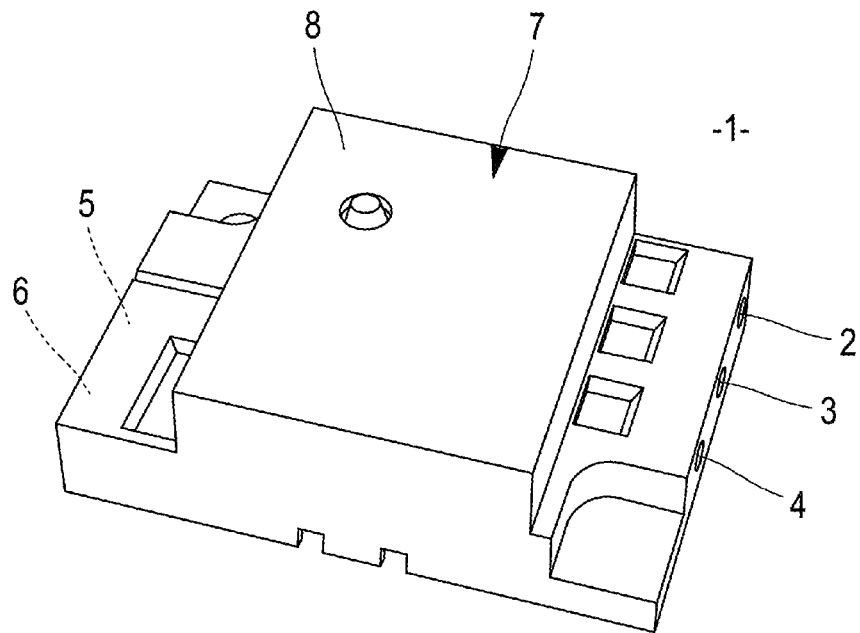
FIG. 1 is a schematic perspective view of an overvoltage protection device.

An overvoltage protection device, hereinafter device 1, as illustrated in FIGS. 1 to 7 is intended to be integrated into an electrical circuit in order to protect one or more electrical apparatuses of said electrical circuit from overvoltages. Such electrical apparatuses are for example LED lighting devices or other devices. The device 1 thus has conductive terminals that are intended to receive cables of the electrical circuit. In FIG. 1, the device 1 has a first conductive terminal 2 intended to be connected to the phase, a second conductive terminal 3 intended to be connected to neutral and a third conductive terminal 4 intended to be connected to ground. This device 1 furthermore has a fourth conductive terminal 5 and a fifth conductive terminal 6 that are intended to connect the device 1 to the electrical circuit (not shown).

This device 1 has a housing 7 in which the various components of said device 1 are housed. The conductive terminals 2 to 6 emerge from the housing 7 in order to allow them to be connected to the power supply circuit or the electrical circuit to be supplied with power. This housing 7 has a receptacle 8 forming an internal recess in which the various components of the device 1 are housed.

Figure 2:
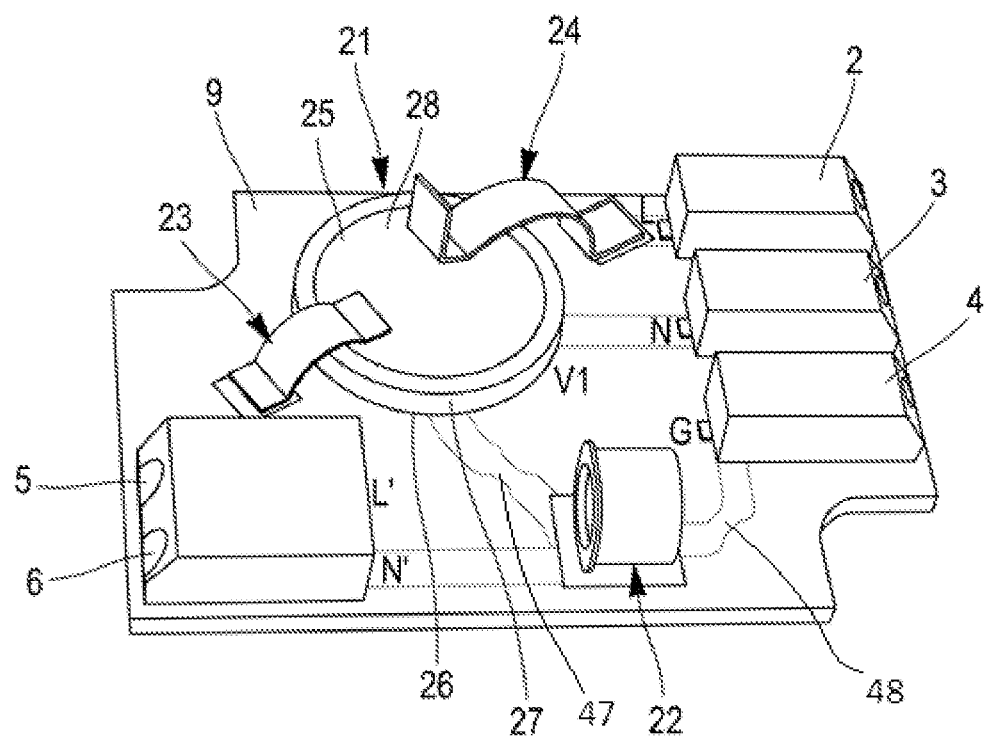
FIG. 2 is a schematic perspective view of the printed circuit board and of the components mounted on said printed circuit board of the overvoltage protection device of FIG. 1.

As illustrated in FIG. 2, the device 1 has a printed circuit board 9. Advantageously, this printed circuit board 9 forms a cover of the housing 7 and interacts with the receptacle 8 so as to close the housing 7 while housing the various components of the device 1 in the internal recess.

Figure 5:
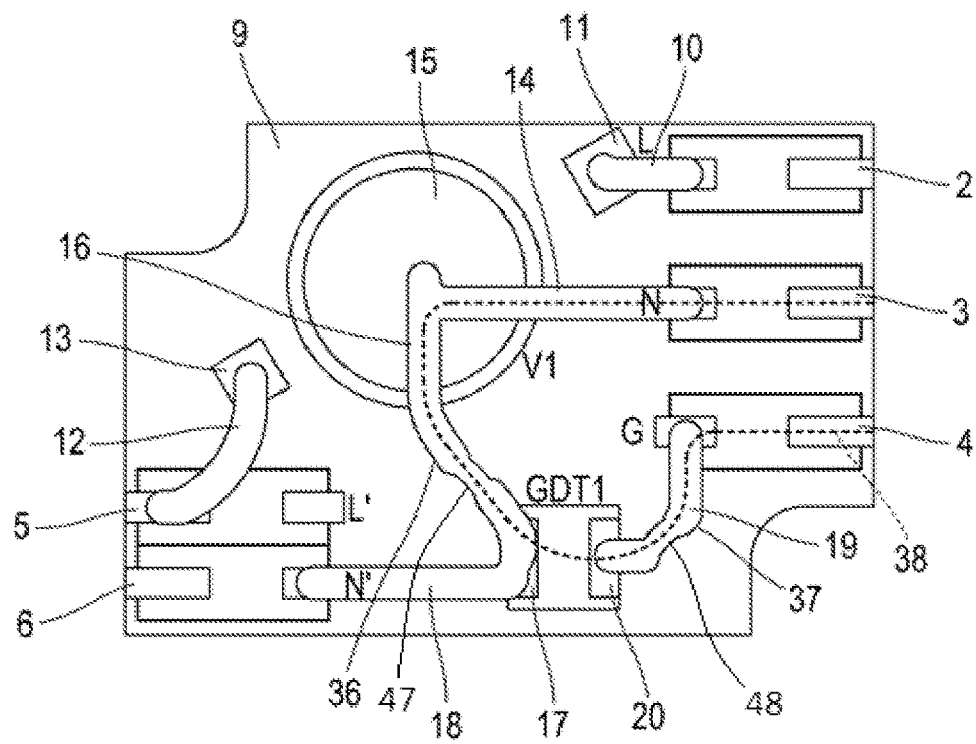
FIG. 5 is a plan view of the printed circuit board of FIG. 2 in which the components mounted on said printed circuit board are omitted, and illustrating the magnetic forces generated by a current flowing through the gas discharge tube.

The printed circuit board 9 has a plurality of conductive tracks allowing the various components of the device 1 to be electrically connected to one another and to the conductive terminals 2 to 6. More particularly, for example as illustrated in FIG. 5, the printed circuit board 9 has a first conductive track 10 electrically connecting the first electrical terminal 2 to a first connection area 11. A second conductive track 12 of the printed circuit board 9 connects a second connection area 13 to the fourth electrical terminal 5. A third conductive track 14 connects a third connection area 15 to the second electrical terminal 3. This third connection area 15 is also connected to a fourth connection area 17 via a fourth conductive track 16. A fifth conductive track 18 connects said fourth connection area 17 to the fifth conductive terminal 6. Lastly, a sixth conductive track 19 connects a fifth connection area 20 to the third electrical terminal 4.

As illustrated in FIG. 2, the device 1 furthermore has a varistor 21, a gas discharge tube 22, a connection tab 23 and a disconnection tab 24.

The varistor 21 has a body made of metal oxide, for example made of zinc oxide. The body of the varistor has a first face 25 and a second face 26 that are flat and parallel. The body of the varistor 21 has a right cylindrical shape, the first face 25 and the second face 26 having circular shapes. A lateral face 27 of the body of the varistor 21 is preferably coated with an epoxy resin.

The first face 25 is coated with a first metal layer 28 made of conductive material. This first metal layer 28 is, for example, a silver flash deposited on the first face 25 by way of a screen-printing deposition method. Such a first metal layer 28 is for example dried by passing through a furnace. Such passing through the furnace is performed, for example, at a temperature of between 130° C. and 170° C. for a few minutes. For example, passing through the furnace involves exposing the first metal layer 28 to a temperature of 150° C. for at least 3 to 5 minutes. The first metal layer is then fastened during curing at a temperature of between 500° C. and 700° C., for example 600° C., for a duration of between 5 hours and 24 hours. Such a first deposited metal layer 28 has a small thickness in comparison with the thickness of the varistor 21, for example of the order of 8 μm to 16 μm, preferably between 8 μm and 12 μm, more preferably about 10 μm.

In the same way, the second face 26 of the body of the varistor 21 is also coated with a second deposited metal layer, for example a layer made of silver. This second metal layer is produced in the same way as the first metal layer 28, through a screen-printing deposition method followed by a drying step and a fastening step.

The varistor 21 is mounted directly on the printed circuit board 9. More particularly, the second metal layer deposited on the second face 26 of the body of the varistor 21 is mounted directly on the printed circuit board 9 in the third connection area 15. In other words, the second metal layer deposited on the second face 26 of the body of the varistor is connected directly in said third connection area 15 to the third conductive track 14 and to the fourth conductive track 16. Said third conductive track 15 thus connects the varistor 21 directly to the second electrical terminal 3.

Moreover, the varistor 21 is also connected to the first connection area 11 and to the second connection area 13. More particularly, the disconnection tab 24 has a first end mounted in the first connection area 11, and therefore electrically connected to the first conductive track 10, and a second end mounted on the first metal layer 28 as is explained in more detail below with reference to FIGS. 3 and 4. The connection tab 23 furthermore has a first end 29 mounted in the second connection area 13, and therefore connected to the second conductive track 12, and a second end 30 mounted on the first metal layer 28.

The gas discharge tube 22 is for its part mounted on the printed circuit board 9 in the fourth connection area 17 and in the fifth connection area 20. Typically, a first terminal of said gas discharge tube 22 is connected to the fourth connection area 17, that is to say to the fourth conductive track 16 and to the fifth conductive track 18, and a second terminal of said gas discharge tube 22 is connected to the fifth connection area 20 and therefore to the sixth conductive track 19. The first terminal of the gas discharge tube 22 is thus electrically connected firstly to the varistor 21 via the fourth conductive track 16 and secondly to the fifth electrical terminal 6 via the fifth conductive track 18. The second terminal of the gas discharge tube 22 is furthermore connected to the third electrical terminal 4 via the sixth conductive track 19.

The printed circuit board 9 thus serves at the same time as a support for the varistor 21, the gas discharge tube 22, the connection tab 23 and the disconnection tab 24, as a connection between the components by virtue of the conductive tracks 10, 12, 14, 16, 18, 19, and as a bottom of the housing 7.

Figure 3:
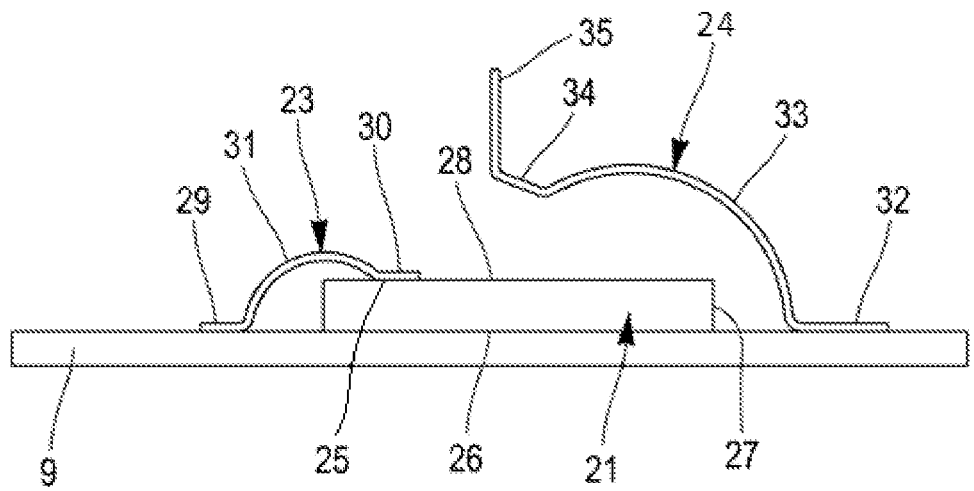
FIG. 3 is a sectional view of FIG. 2 at the varistor.
Figure 4:
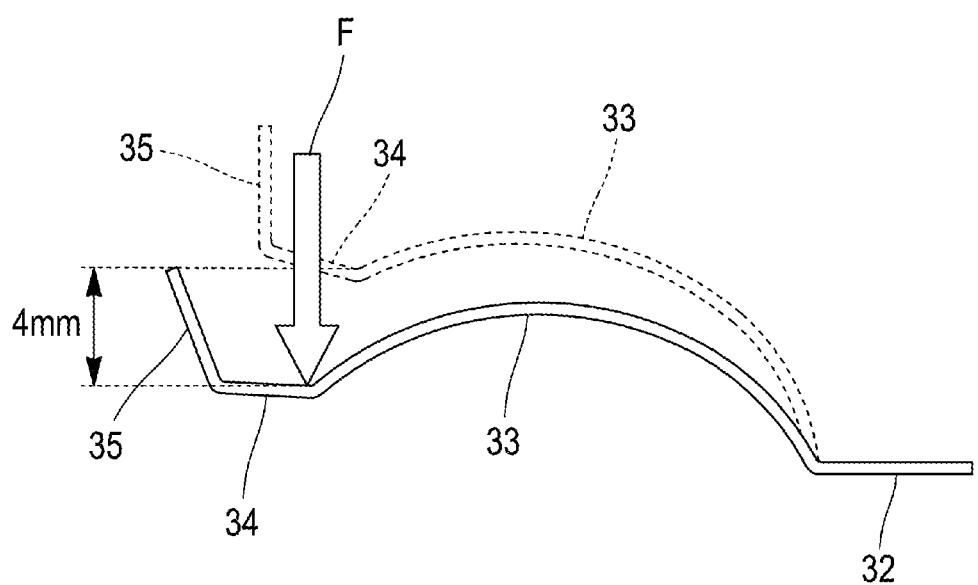
FIG. 4 is a sectional view of the disconnection tab of FIG. 3.

The link between the printed circuit board 9 and the varistor 21 is described below with reference to FIGS. 3 and 4.

The first end 29 of the connection tab 23 is flat to be able to be fastened to the printed circuit board 9 in the second connection area 13, that is to say in contact with the second conductive track 12. Likewise, the second end 30 of said connection tab 23 is flat so as to be able to be fastened to the first metal layer 28. The connection tab has a curved central portion 31 connecting the first end 29 and the second end 30. This central portion 31 is rigid and designed so as not to exert stress on the printed circuit board 9 and/or on the first metal layer 28.

The disconnection tab 24 is in the form of a leaf spring. This disconnection tab 24 is for example made from a copper alloy. The disconnection tab 24 is for example made from a copper, beryllium, and nickel alloy, which has good conductivity and elasticity.

In succession along a longitudinal direction of the disconnection tab 24, said disconnection tab 24 has an anchoring portion 32, a flexible portion 33, a fastening portion 34 and a return 35. In the same way as the ends 29 and 30 of the connection tab 23, the anchoring portion 32 of the disconnection tab 24 is flat so as to be able to be fastened to the printed circuit board 9 in the first connection area 11 that is electrically connected to the first conductive track 10.

The fastening portion 34 is fastened directly to the first metal layer 28, such that the first metal layer 28 performs the function of a connection electrode of the varistor 21. The fastening portion 34 is flat so as to be able to ensure stable fastening onto the first metal layer 28. The contact surface between the fastening portion 34 and the first metal layer 28 is determined as a function of the intended lightning current for the device 1. The fastening portion 34 has for example a contact surface of between 5 mm$^2$ and about 17.5 mm$^2$, for example 9 mm$^2$ or 16.5 mm$^2$, with the first metal layer 28. This link between the fastening portion 34 and the first metal layer 28 is created by way of a thermofusible link, which is a link able to degrade in response to a temperature exceeding a threshold value, for example a threshold temperature of between 130° C. and 142° C., preferably between about 138° C. and 142° C. This thermofusible link is formed by any appropriate means, for example low-temperature soldering. This thermofusible solder may be produced with the addition of material, such as for example tin or another material. This addition of material is for example a tin alloy without lead or cadmium in the form of a wire, tab or preform associated with a cleaning agent such as soldering flux.

The flexible portion 33 that connects the anchoring portion 32 and the fastening portion 34 is curved and elastic. This flexible portion 33 makes it possible to move the fastening portion 34 away from the first metal layer 28 when the thermofusible link degrades. In order to ensure this moving apart of the fastening portion 34 and the first metal layer 28 when the thermofusible link degrades, the disconnection tab 24 is prestressed. However, as the first metal layer 28 is relatively thin, of the order of a few μm, for example between 8 μm and 16 μm, preferably between 8 μm and 12 μm, for example 10 μm, the flexible portion 33 has to have elastic characteristics such that this prestress is not excessively great. Specifically, an excessively great prestress could tear away the first metal layer 28 deposited on the body of the varistor 21 and therefore damage the varistor 21. However, the flexible portion 33 has to have enough elasticity to satisfactorily move the fastening portion 34 apart from the first metal layer 28 when the thermofusible link degrades.

In an exemplary embodiment, the flexible portion 33 has for example a length of between 16 mm and 18 mm, preferably about 17.2 mm, a width of between 3 and 7 mm, preferably 4 mm, and a thickness of between 0.3 and 0.6 mm, preferably about 0.4 mm. In this example, as illustrated in FIG. 4, the flexible portion 33 has an elasticity such that a force F of between 5 N and 10 N, preferably about 6.5 N, applied to the junction between the flexible portion 33 and the fastening portion 34 and along a direction perpendicular to the plane of the anchoring portion 32 brings about a displacement of about 4 mm at said junction.

In order to achieve the elasticity characteristics of the flexible portion, the disconnection tab 24 may be subjected to various treatments, such as for example to a tempering heat treatment intended to give it these desired mechanical characteristics. The disconnection tab 24 may for example be rough or surface-treated, for example through silvering or tinning. The disconnection tab 24 has a rigidity of between 1250 N/M and 2500 N/M, preferably of between 1500 N/M and 1750 N/M, more preferably about 1650 N/M. The disconnection tab 24 preferably has a Vickers hardness of between about 250 and 310.

With reference to FIG. 5, it is observed that the fourth conductive track 16 has a first curved portion 36. Likewise, the sixth conductive track 19 has a second curved portion 37. The first curved portion 36 and the second curved portion 37 have a center of curvature situated on one and the same side of said conductive tracks 16 and 19. In other words, the first curved portion 36 and the second curved portion 37 have respective concavities facing one another. Thus, as illustrated in FIG. 5, the link between the second electrical terminal 3 and the third electrical terminal 4 is substantially in the shape of an open loop 38 between said electrical terminals 3 and 4, this open loop 38 being illustrated schematically in FIGS. 5 and 6 in dotted lines. This open loop 38 passes through the third conductive track 14, the fourth conductive track 16 and the sixth conductive track 19 via the gas discharge tube 22 (not illustrated in FIGS. 5 and 6). Thus, in the presence of an electric current flowing through this open loop 38, magnetic forces are generated towards the outside of this loop, as illustrated by the arrows 39 in FIG. 6.

The first curved portion 36 has a first thinned track portion 40. Likewise, the second curved portion 37 has a second thinned track portion 41. These thinned portions 40 and 41 form thermofusible areas 47, 48 that degrade in the presence of an overcurrent. More particularly, as explained below, an overcurrent flowing through these thinned track portions 40 and 41 causes them to melt, thereby interrupting the corresponding conductive track at said thinned track portion, achieving the function of a fusible area.

Figure 6:
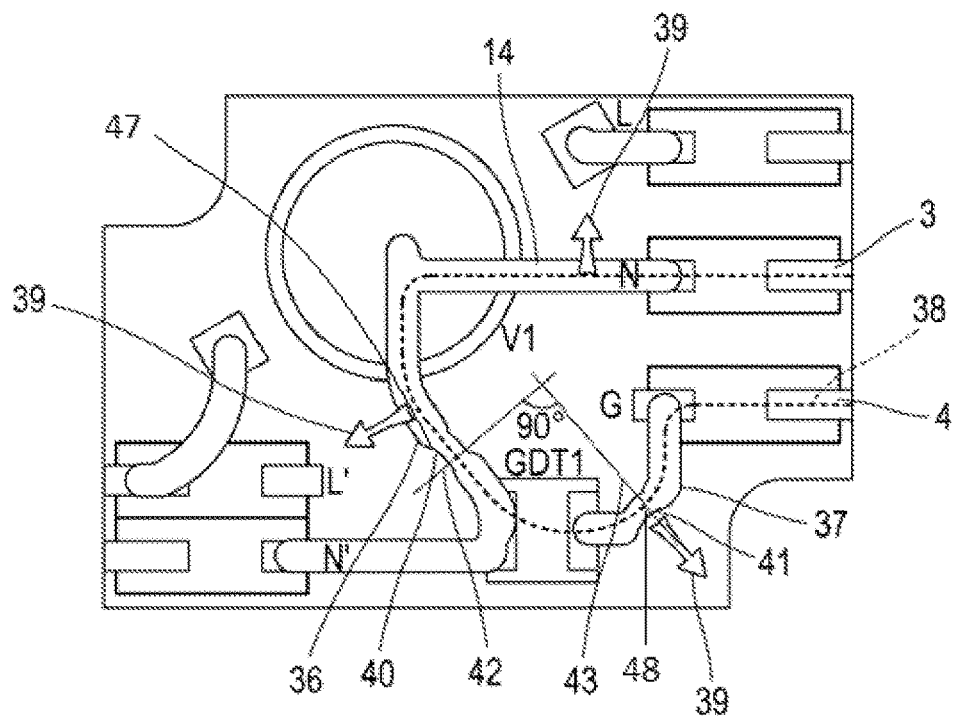
FIG. 6 is a plan view of the printed circuit board of FIG. 2 in which the components mounted on said printed circuit board are omitted, and illustrating the areas where arcs are generated in the presence of an overvoltage.
Figure 7:
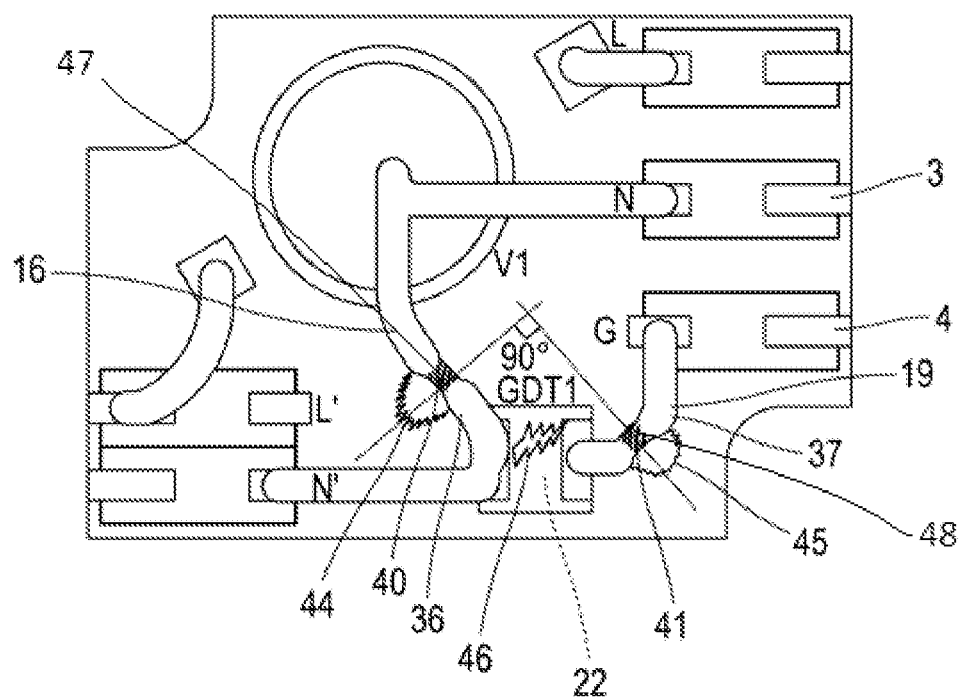
FIG. 7 is a plan view of the printed circuit board of FIG. 2 in which the components mounted on said printed circuit board are omitted, and illustrating the orientation of the arcs that are generated in the presence of an overvoltage.

Preferably, a tangent to the first curved portion 36 at the first thinned portion 40, preferably taken in the middle of said first thinned portion 40, is perpendicular to a tangent to the second curved portion 37 at the second thinned portion 41, preferably taken in the middle of said second thinned portion 41. In other words, a circle tangent to the middle of the first thinned portion 40 has a radius forming an angle of between 80° and 100°, preferably about 90°, as illustrated in FIGS. 6 and 7, with the radius of a circle tangent to the middle of the second thinned portion 41. Such perpendicular radii are illustrated for example in FIG. 6 with the references 42 for the first curved portion 36 and 43 for the second curved portion 37.

During normal operation of the electrical circuit, the current flows between the first electrical terminal 2 and the fourth electrical terminal 5 via the first conductive track 10, the disconnection tab 24, the first metal layer 28, the connection tab 23 and the second conductive track 12. Moreover, during normal operation of the electrical circuit, the current also flows between the fifth electrical terminal 6 and the first electrical terminal 3 via the fifth conductive track 18, the fourth conductive track 16 and the third conductive track 14.

The varistor 21 and the gas discharge tube 22 make it possible to protect the electrical circuit in the presence of an overvoltage.

In the presence of an overvoltage, a first electrical arc 46 illustrated in FIG. 7 is generated in the gas discharge tube 22, thus connecting the electrical circuit and the third electrical terminal 4, typically the electrical terminal intended to be connected to ground.

The first thinned portion 40 melts under the effect of the overcurrent, the fourth conductive track 16 thus being interrupted at said first thinned portion 40 that has melted. Likewise, the second thinned portion 41 melts under the effect of the overcurrent, the sixth conductive track 19 thus being interrupted at said second thinned portion 41 that has melted. The length of the first thinned portion 40 is calibrated such that, after said first thinned portion 40 has melted, a second electrical arc 44 is generated and maintained through the presence of current and of a flow of current between the parts of the fourth conductive track 16 that have been separated by said first thinned portion 40 that has melted. In the same way, the length of the second thinned portion 41 is such that an overcurrent causes the second thinned portion to melt and that a third electrical arc 45 between the parts of the sixth conductive track 19 that were separated when the second thinned portion 41 melted is able to be maintained by the presence of a current and a flow of current.

In other words, in the presence of an overcurrent, the first thinned portion 40 and the second thinned portion 41 make it possible to divide the electrical arc normally generated in the gas discharge tube 22 into three series electrical arcs, a second arc 44 being located on the fourth conductive track 16, a first arc 46 being located in the gas discharge tube 22 and a third arc 45 being located on the sixth conductive track 19. This division into a plurality of electrical arcs 44, 45 and 46 offers a better ability to interrupt these arcs.

Moreover, the fact that the thinned portions 40 and 41 are located on curved portions whose radii of curvature are situated on one and the same side advantageously makes it possible to orient the arcs 44 and 45. As explained above, the curvature of the tracks 36 and 37 makes it possible to form the open loop 38. The arcs 44 and 45 generated on the curved portions 36 and 37 of such an open loop 38, typically at the thinned portions 40 and 41, are generated towards the outside of this open loop 38. As a result, as illustrated in FIG. 7, the arcs 44 and 45 generated at the thinned portions 40 and 41 are therefore oriented towards the outside of the open loop 38, and therefore in opposite directions, thus preventing these arcs 44 and 45 from interfering with one another and from coming into contact with one another. This orientation of the arcs 44 and 45 due to the curved portions 36 and 37 thus ensures that the thinned portions 40 and 41 effectively protect the gas discharge tube 22 by dividing the arc maintained by the current and the flow of current into three arcs 44, 45 and 46, two of said arcs being situated on either side of said gas discharge tube 22.

Moreover, in the presence of an overcurrent, the thermofusible link between the disconnection tab 24 and the first metal layer 28 of the varistor 21 melts. From then on, the first metal layer 28 no longer exerts a retaining force, on the fastening portion 34 via the thermofusible link, that opposes the force exerted on said fastening portion 34 by the flexible portion 33. The flexible portion 33, in the absence of an opposing force, moves the fastening portion 34 elastically away from the first metal layer 28, thus disconnecting the connection between said disconnection tab 24 and the varistor 21.

The method for manufacturing the overvoltage protection device is described below. In a first step, the paste to be soldered is deposited on the printed circuit board 9. In a second step, the components, that is to say the varistor 21, the gas discharge tube 22, the connection tab 23 and the disconnection tab 24 are deposited on the printed circuit board 9. The assembly thus formed is passed through the furnace in a third step. This passing through the furnace is performed for example at a temperature greater than 200° C., for example about 270° C., and makes it possible to perform all of the soldering operations in a single step, other than the thermofusible link between the disconnection tab 24 and the varistor 21. In a fourth step, low-temperature soldering, for example between about 130° C. and 142° C., is used to form the thermofusible link between the disconnection tab 24 and the first metal layer 28 of the varistor 21. This low-temperature soldering is for example performed with the addition of a tin-bismuth alloy in the form of a wire, tab or preform. The assembly thus formed is then tropicalized using a varnish or resin spray.

Although the invention has been described in connection with a plurality of particular embodiments, it is obvious that it is in no way limited thereby and that it comprises all technical equivalents of the means described and also combinations thereof if these fall within the scope of the invention as defined by the claims.

The use of the verb "have", "comprise" or "include" and of the conjugated forms thereof does not exclude the presence of elements or steps other than those stated in a claim.

The invention claimed is:

1. An overvoltage protection device having:
    a printed circuit board,
    a varistor,
    a gas discharge tube, the varistor and the gas discharge tube connected in series between a second electrical connection terminal and a third electrical connection terminal of the printed circuit board,
    wherein:
    the varistor is connected to the second electrical connection terminal by a third conductive track of the printed circuit board,
    the gas discharge tube is connected to the varistor by a fourth conductive track of the printed circuit board,
    the gas discharge tube is connected to the third electrical connection terminal by a sixth conductive track of the printed circuit board, and
    wherein the fourth conductive track and the sixth conductive track each have a curved portion, said curved portions connected to the gas discharge tube and situated on either side of the gas discharge tube, said curved portions each having a concavity facing in a same orientation with respect to the gas discharge tube, said curved portions each having a thermofusible area able to separate a corresponding track into two separate parts in response to an overcurrent, a distance between said two separate parts of each track configured to allow a generation of an electrical arc between the two separate parts in response firstly to an overvoltage able to activate the gas discharge tube and secondly a current and a voltage that keep the gas discharge tube in a conductive state.

2. The overvoltage protection device according to claim 1, wherein the third conductive track, the fourth conductive track and the sixth conductive track together form an open magnetic field loop between the second electrical connection terminal and the third electrical connection terminal in the presence of a current between said second electrical connection terminal and third electrical connection terminal.

3. The overvoltage protection device according to claim 2, wherein a radius of a circle tangent to the thermofusible area of the fourth conductive track forms an angle between 80 and 100 degrees with a radius of a circle tangent to the thermofusible area of the sixth conductive track.

4. The overvoltage protection device according to claim 3, wherein the second electrical connection terminal is connected to a neutral of an electric power supply circuit and the third electrical connection terminal is connected to ground, the gas discharge tube is connected to a fifth electrical connection terminal by a fifth conductive track, said fifth conductive track is connected to the third conductive track, said fifth electrical connection terminal is connected to a neutral of an electrical circuit supplied with power by the electric power supply circuit.

5. The overvoltage protection device according to claim 4, wherein the varistor is connected to a fourth electrical terminal by a second conductive track, said fourth electrical terminal connected to a phase of the electrical circuit supplied with power by the electric power supply circuit.

6. The overvoltage protection device according to claim 2, wherein the varistor is connected to a first electrical connection terminal by a disconnection tab, said disconnection tab connected to the varistor by a thermofusible link able to disconnect the link between the first electrical connection terminal and the varistor in response to an increase in the temperature of the varistor beyond a threshold value, said third electrical connection terminal connected to a phase of an electric power supply circuit.

7. The overvoltage protection device according to claim 2, wherein the second electrical connection terminal is connected to a neutral of an electric power supply circuit and the third electrical connection terminal is connected to ground, the gas discharge tube is connected to a fifth electrical connection terminal by a fifth conductive track, said fifth conductive track is connected to the third conductive track, said fifth electrical connection terminal is connected to a neutral of an electrical circuit supplied with power by the electric power supply circuit.

8. The overvoltage protection device according to claim 7, wherein the varistor is connected to a fourth electrical connection terminal by a second conductive track, said fourth electrical connection terminal connected to a phase of the electrical circuit supplied with power by the electric power supply circuit.

9. The overvoltage protection device according to claim 1, wherein a radius of a circle tangent to the thermofusible area of the fourth conductive track forms an angle between 80 and 100 degrees with a radius of a circle tangent to the thermofusible area of the sixth conductive track.

10. The overvoltage protection device according to claim 9, wherein the varistor is connected to a first electrical connection terminal by a disconnection tab, said disconnection tab connected to the varistor by a thermofusible link able to disconnect the link between the first electrical connection terminal and the varistor in response to an increase in the temperature of the varistor beyond a threshold value, said first electrical connection terminal connected to a phase of an electric power supply circuit.

11. The overvoltage protection device according to claim 9, wherein the second electrical connection terminal is connected to a neutral of an electric power supply circuit and the third electrical connection terminal is connected to ground, the gas discharge tube is connected to a fifth electrical connection terminal by a fifth conductive track, said fifth conductive track is connected to the third conductive track, said fifth electrical connection terminal is connected to a neutral of an electrical circuit supplied with power by the electric power supply circuit.

12. The overvoltage protection device according to claim 11, wherein the varistor is connected to a fourth electrical connection terminal by a second conductive track, said fourth electrical terminal connected to a phase of the electrical circuit supplied with power by the electric power supply circuit.

13. The overvoltage protection device according to claim 1, wherein the varistor is connected to a first electrical connection terminal by a disconnection tab, said disconnection tab connected to the varistor by a thermofusible link able to disconnect the link between the first electrical connection terminal and the varistor in response to an increase in the temperature of the varistor beyond a threshold value, said first electrical connection terminal connected to a phase of an electric power supply circuit.

14. The overvoltage protection device according to claim 1, wherein the second electrical connection terminal is connected to a neutral of an electric power supply circuit and the third electrical connection terminal is connected to ground, the gas discharge tube is connected to a fifth electrical connection terminal by a fifth conductive track, said fifth conductive track is connected to the third conductive track, said fifth electrical connection terminal is connected to a neutral of an electrical circuit supplied with power by the electric power supply circuit.

15. The overvoltage protection device according to claim 14, wherein the varistor is connected to a fourth electrical connection terminal by a second conductive track, said fourth electrical connection terminal connected to a phase of the electrical circuit supplied with the power by the electric power supply circuit.

16. A method of manufacturing an overvoltage protection device, comprising the steps of:
providing a printed circuit board having a plurality of electrical connection terminals and a plurality of conductive connection tracks,
providing a varistor,
providing a gas discharge tube,
depositing the varistor on the printed circuit board such that the varistor is connected to a second electrical connection terminal by a third conductive track,
depositing the gas discharge tube on the printed circuit board such that the varistor and the gas discharge tube are connected in series between the second electrical connection terminal and a third electrical connection terminal of the printed circuit board via a fourth conductive track connecting the varistor and the gas discharge tube and a sixth conductive track connecting the gas discharge tube to said third electrical connection terminal, the fourth conductive track and the sixth conductive track each having a curved portion, said curved portions connected to the gas discharge tube and situated on either side of the gas discharge tube, said curved portions each having a concavity facing in a same orientation with respect to the gas discharge tube, said curved portions each having a thermofusible area able to separate a corresponding track into two separate parts in response to an overcurrent, a distance between said two separate parts of said tracks configured so as to allow a generation of an electrical arc between said two separate parts in response firstly to an overvoltage able to activate the gas discharge tube and secondly a current and a voltage that keep said gas discharge tube in the conductive state.

17. The method according to claim 16, wherein the varistor comprises a varistor body made of metal oxide, having a face and a conductive metal layer deposited on said face, the method further comprising the steps of:
depositing a disconnection tab on a fifth conductive track of the printed circuit board, said fifth conductive track connecting said disconnection tab and a first electrical connection terminal, the step of depositing the varistor on the printed circuit board is performed such that an end of the disconnection tab opposite the third conductive track faces and is spaced from the metal layer of the varistor,
elastically deforming the disconnection tab so as to bring a second end of said disconnection tab into contact with a metal layer, and
performing thermofusible soldering between said second end of the disconnection tab and the metal layer.

* * * * *